United States Patent [19]

Nozick

[11] Patent Number: 5,150,064

[45] Date of Patent: Sep. 22, 1992

[54] METHOD AND APPARATUS FOR DETERMINING PARAMETERS OF A TRANSMISSION LINE DEPLOYED IN A SEAWATER ENVIRONMENT

[75] Inventor: Irwin Nozick, Portsmouth, R.I.

[73] Assignee: The United States of America as represented by the Secretary of the Navy, Washington, D.C.

[21] Appl. No.: 738,762

[22] Filed: Aug. 1, 1991

[51] Int. Cl.⁵ .................... G01R 27/28; H04M 3/26
[52] U.S. Cl. .................... 324/691; 324/543; 379/24
[58] Field of Search ............... 324/522, 523, 525, 526, 324/527, 537, 540, 543, 637, 639, 691; 379/240, 324, 346, 394, 414, 30, 24

[56] References Cited

U.S. PATENT DOCUMENTS 4,399,402 8/1983 Pelletier .................... 324/525
4,853,616 8/1989 Gard .................... 324/525

OTHER PUBLICATIONS

"Engineering Circuit Analysis"; 3rd Edition; William H. Hayt, Jr. and Jack E. Kemmery; ©1978 by McGraw-Hill, pp. 550-551.

Primary Examiner—Gerard R. Strecker
Assistant Examiner—Diep Do
Attorney, Agent, or Firm—Michael J. McGowan; Prithvi C. Lall; Michael F. Oglo

[57] ABSTRACT

A method and apparatus are provided for determining transmission line parameters of a length of single-wire transmission line that is deployed in seawater. The seawater is utilized as an electrically grounded return for the transmission line such that a two-port network is formed at either end of the transmission line. An alternating voltage of known amplitude and frequency is generated and applied to a first end of the length of transmission line. Open and short circuit parameters at the first end are then determined as a second end of the length of transmission line is alternately switched between a open and short circuit mode. The alternating voltage of known amplitude and frequency is then applied to the second end as the first end is alternately switched between an open and short circuit mode so that open and short circuit parameters may be similarly determined at the second end. The open and short circuit parameters determined at both ends are indicative of the transmission line parameters at the known frequency for the length of transmission line deployed.

6 Claims, 2 Drawing Sheets

METHOD AND APPARATUS FOR DETERMINING PARAMETERS OF A TRANSMISSION LINE DEPLOYED IN A SEAWATER ENVIRONMENT

STATEMENT OF GOVERNMENT INTEREST

The invention described herein may be manufactured and used by or for the Government of the United States of America for Governmental purposes without the payment of any royalties thereon or therefor.

BACKGROUND OF THE INVENTION

(1) Field of the Invention

The present invention relates generally to measurements of line impedance and more particularly to a method and apparatus for accurately modeling a transmission line deployed in seawater for the purpose of determining amplitudes of received transmissions.

(2) Description of the Prior Art

Single wire transmission lines are used extensively by the United States Navy to communicate with underwater weapons launched from either surface ships or submarines. Typically, the transmission line (also known as a guidance wire) is coiled at each end such that one coiled end is maintained on the launching ship and the other coiled end is maintained within the weapon. Upon launching the weapon, the guidance wire is paid out from both the ship coil and the weapon coil. The paid out portion of the guidance wire is deployed in the seawater.

Guidance command (also known as command tone voltage values) consisting of a known voltage amplitude and frequency are sent from the ship to the weapon via the guidance wire. Responses by the weapon (also known as telcom tone voltage values) are then transmitted back to the ship via the guidance wire. Development of new combat systems and weapons required an accurate understanding of how the command and telcom tone voltage values are affected as more and more of the guidance wire is paid out. Accordingly, it is imperative that quantitative data be available for modeling of the guidance wire and payout coils in order to predict the amplitude of command and telcom tones being received. This will maximize design efficiency and eliminate the possibility that a marginal condition exists at a particular payout distance. Current methods of generating such data involve trial and error in an actual use environment. However, there is no current method of predicting the amplitude of a tone received for various payout lengths of cable, i.e., part of the length being coiled and part of the length being deployed in seawater.

SUMMARY OF THE INVENTION

Accordingly, it is an object of the present invention to provide a method and apparatus for predicting guidance wire parameters for a length of guidance wire that is at least partially deployed in seawater.

Another object of the present invention is to provide a method and apparatus for determining single wire transmission line parameters for a variety of payout lengths and tones where the payout lengths are deployed in seawater.

Other objects and advantages of the present invention will become more obvious hereinafter in the specification and drawings.

In accordance with the present invention, a method and apparatus are provided for determining transmission line parameters of a length of single-wire transmission line. Typically, the length of transmission line is partially coiled and partially paid out and both portions are deployed in seawater. The seawater is utilized as an electrically grounded return for the transmission line such that a two-port network is formed at either end of the transmission line. An alternating voltage of known amplitude and frequency is generated and applied to a first end of the length of transmission line. Open circuit impedance and short circuit impedance parameters at the first end are then determined as a second end of the length of transmission line is alternately switched between an open and short circuit mode. The alternating voltage of known amplitude and frequency is then applied to the second end as the first end is alternately switched between an open and short circuit mode so that impedance parameters may be similarly determined at the second end. The open and short circuit impedances are then used to determine a T-equivalent network. The T-equivalent networks are independent of the applied voltages used to make the original measurements and are only dependent on the amount of wire paid out from the coil and the tone frequency applied thereto. The T-equivalent networks may be used to accurately model the transmission line.

BRIEF DESCRIPTION OF THE DRAWING(S)

DESCRIPTION OF THE PREFERRED EMBODIMENT(S)

Figure 1:
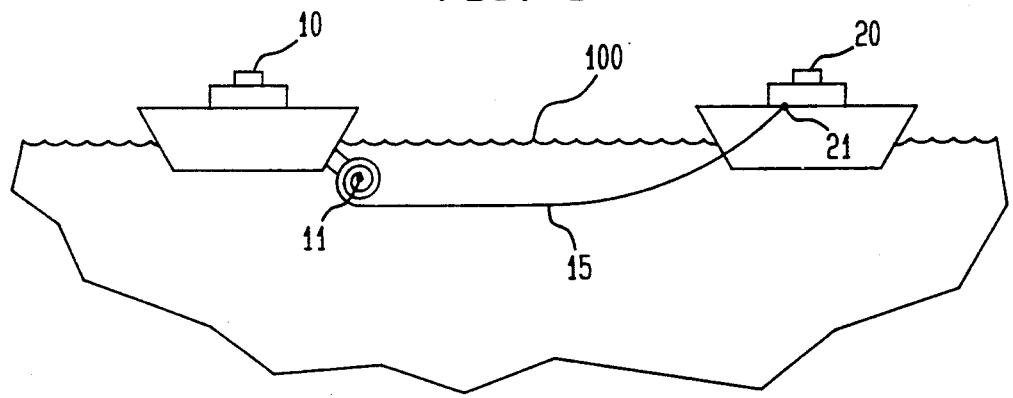
FIG. 1 is a test set-up used by the method of the present invention.

Referring now to the drawings, and in particular to FIG. 1, a typical test set-up used by the method of the present invention is shown. Two ships 10 and 20 are afloat on seawater 100. Ships 10 and 20 are tethered to one another via a guidance wire 15 to be tested. Guidance wire 15 is a conventional, electrically insulated single wire transmission line. Guidance wire 15 is generally partially coiled at ship 10 and partially paid out such that both the coiled and paid out portions are deployed in seawater 100 as shown. Accordingly, its length extends from one end 11, i.e. the beginning of the coil on ship 10, to end 21 on ship 20.

Figure 2:
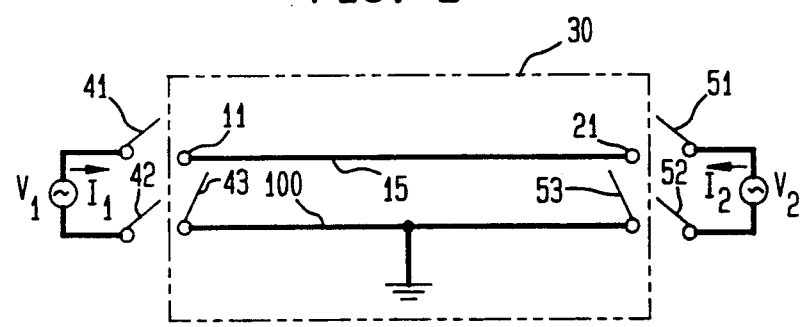
FIG. 2 is circuit schematic of the two-port network formed by the method of the present invention.

The method of the present invention is a simple technique to determine transmission line parameters (e.g. impedance) for guidance wire 15 for a variety of specified payout lengths. Toward this end, seawater 100 is utilized as a grounded return for guidance wire 15. In this way, a two-port network 30, shown schematically in FIG. 2, is formed by the guidance wire 15 and seawater 100. In particular, guidance wire 15, having ends 11 and 21, forms one leg of network 30 while seawater 100, via contact with the hulls of ships 10 and 20, forms the grounded return leg of network 30.

Figure 3:
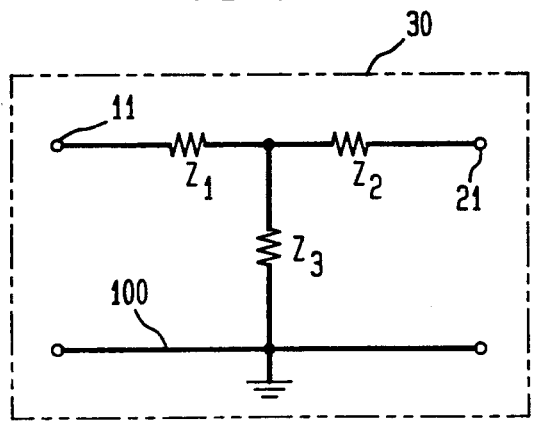
FIG. 3 is a T-equivalent of the two-port network in FIG. 2.

In order to determine transmission line parameters for guidance wire 15, a "T-equivalent" of the two-port network 30 may be derived as shown in FIG. 3 where those elements common with FIGS. 1 and 2 share like reference numerals. Knowledge of the values $Z_1$, $Z_2$ and $Z_3$ for a specific payout length of guidance wire 15 at a specific tone (frequency) value provides the means to predict the actual tone voltage value received by the weapon/ship in an operational system. Accordingly, the values for $Z_1$, $Z_2$, and $Z_3$ must be determined for a variety of payout lengths and frequency values.

Since $Z_1$, $Z_2$ and $Z_3$ cannot be directly measured, it is necessary to calculate them based on the measurement of four measurable circuit impedance parameters for the two-port network 30. With continued reference to FIG. 2, the four parameters are defined as follows:

$Z_{1-o} = V_1/I_1$ where end 21 forms an open-circuit with respect to ground, i.e. seawater 100;

$Z_{1-s} = V_1/I_1$ where end 21 is short-circuited to ground;

$Z_{2-o} = V_2/I_2$ where end 11 forms an open-circuit with respect to ground; and $Z_{2-s} = V_2/I_2$ where end 11 is short-circuited to ground.

Note that all Z values are vectors having a real component and an imaginary component. Once these circuit parameters are measured (e.g., with a voltmeter, ammeter and phase meter) for the specified payout length at a specified tone frequency value, $Z_1$, $Z_2$ and $Z_3$ may be calculated as follows:

$$Z_3 = \sqrt{(Z_{1-o}Z_{2-o}) - (Z_{1-s}Z_{2-o})} \quad (1)$$

$$Z_2 = Z_{2-o} - Z_3 \quad (2)$$

$$Z_1 = Z_{1-o} - Z_3 \quad (3)$$

The following mathematical analysis is the proof for the derivations of equations (1), (2) and (3). knowing that $$Z_{1-o} = Z_1 + Z_3 \quad (4)$$

$$Z_{2-o} = Z_2 + Z_3 \quad (5)$$

and $$Z_{1-s} = Z_1 + (Z_2 Z_3)/(Z_2 + Z_3) \quad (6)$$

and using equations (4) and (5), $$Z_{1-o}Z_{2-o} = Z_1 Z_2 + Z_1 Z_3 + Z_2 Z_3 + Z_3^2 \quad (7)$$

and $$Z_{1-s}Z_{2-o} = Z_1 Z_2 + Z_1 Z_3 + Z_2 Z_3 \quad (8)$$

Finally, equation (1) is arrived at by subtracting equation (8) from equation (7) and taking the square root thereof.

Measurement of the aforementioned four circuit parameters is operationally achieved as follows. Referring again to FIG. 2, an alternating voltage source $V_1$ (typically aboard ship 10) is connected to two-port network 30 as switches 41 and 42 connect voltage source V1 to the end 11 of guidance wire 15 and ground, i.e. seawater 100, respectively. At the other end of guidance wire 15, a switch 53 is alternately used to form an open circuit (for measuring $Z_{1-o}$) and to form a short circuit (for measuring $Z_{1-s}$) at the port formed between end 21 and seawater 100. Once this is done for the specified payout length and tone frequency value, switches 41, 42 and 53 are opened. Switches 51 and 52 are then closed to connect alternating voltage source $V_2$ (typically aboard ship 20) to two-port network 30 at the other end 21 of guidance wire 15. Switch 43 is alternately used to form an open circuit (for measuring $Z_{2-o}$) and to form a short circuit (for measuring $Z_{1-s}$) at the port formed between end 11 and seawater 100. This process is then repeated for other tone frequency values and other payout lengths of guidance wire 15. The resulting calculated matrix of values $Z_1$, $Z_2$ and $Z_3$ as a function of guidance wire payout length and tone frequency may be used to model guidance wire 15.

Figure 4:
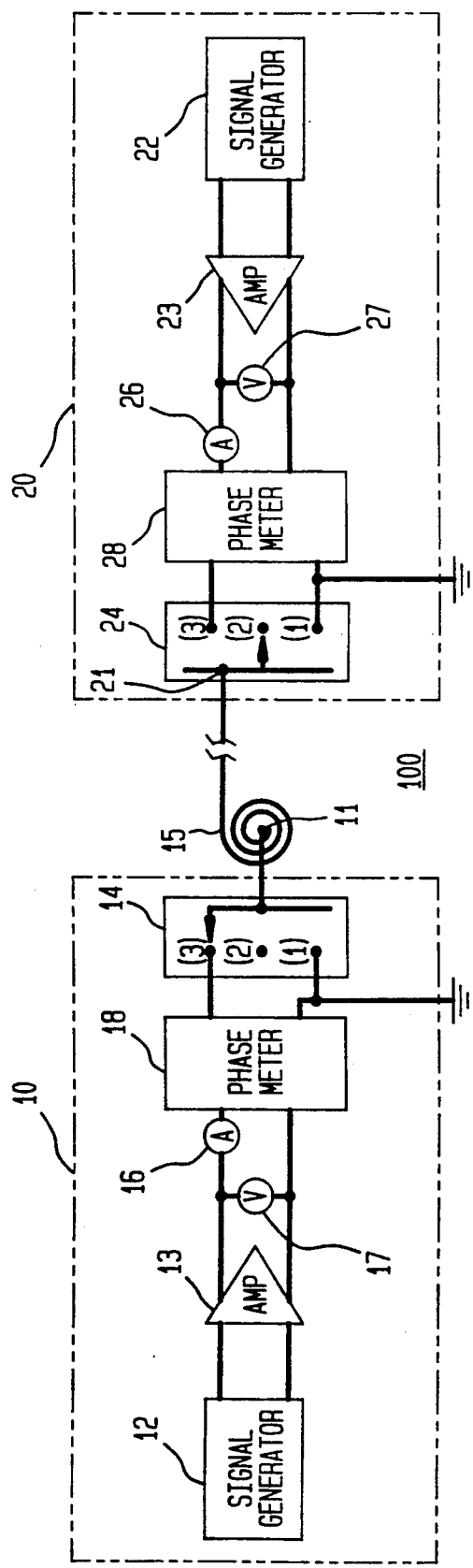
FIG. 4 is a block diagram of the measuring equipment arrangement used in a preferred embodiment of the present invention.

The means used to accomplish the above described inventive method are numerous. One such measuring equipment arrangement is shown in block diagram form in FIG. 4. Once again, like reference numerals will be used for the elements common with the previous figures. However, it is to be appreciated that the embodiment in FIG. 4 is for purposes of description only and is not a limitation of the present invention.

Specifically, a signal generator 12 aboard ship 10 generates a tone which is amplified by amplifier 13. For measurement of $Z_{1-o}$, switch box 14 must be in position (3) as shown while switch box 24 aboard ship 20 must be in position (2) as shown. This creates the necessary open circuit condition at end 21 of guidance wire 15. With switch boxes 14 and 24 positioned accordingly, an ammeter 16 measures $I_1$, a voltmeter 17 measures $V_1$ and a phase meter 18 will measure the phase relationship of the current and voltage. This process is repeated for the measurement of $Z_{1-s}$, $Z_{2-o}$ and $Z_{2-s}$. Switch boxes 14 and 24 are positioned as follows for these measurements:

|  | Switch box 14 | Switch box 24 |
| --- | --- | --- |
| $Z_{1-s}$ | position (3) | position (1) |
| $Z_{2-o}$ | position (2) | position (3) |
| $Z_{2-s}$ | position (1) | position (3) |

Note that signal generator 22, amplifier 23, ammeter 26, voltmeter 27 and phase meter 28 are similarly connected as shown to measure $I_2$, $V_2$ and the phase relationship of $I_2$ and $V_2$, respectively.

The advantages of the present invention are numerous. By utilizing the seawater as an electrically grounded return line, highly accurate models of a single wire transmission line deployed in the seawater may be made. Advance knowledge of a guidance wire's characteristics will allow for more accurate design of systems that send and receive tone voltage values over the guidance wire. The resulting matrix that generated by the present method and apparatus will further have great utility in the actual operation of such systems.

While the present method and apparatus have been described with respect to specific embodiments thereof, it is not so limited. For example, it would not be necessary to use two ships to accomplish the method. The coil of guidance wire might be fixed to land or an underwater platform. Furthermore, the nonpaidout portion need not be coiled although it typically is to prevent snags upon deployment. Finally, the order of measuring the four circuit parameters is not critical to the present invention. Thus, it will be understood that many additional changes in the details, materials, steps and arrangement of parts, which have been herein described and illustrated are possible without deviating from the teachings of subject invention.

What is claimed is:

1. A method for determining transmission line parameters of an underwater vehicle'guidance wire comprises the steps of:

deploying the guidance wire in seawater, wherein the guidance wire is partially coiled and partially paid out to a known length;

generating, for a plurality of known lengths, a plurality of alternating voltages of known amplitude and frequency, and applying same to a first end of the guidance wire wherein the seawater serves as an electrically grounded return for the guidance wire;

determining, for the plurality of alternating voltages at each of the known lengths, open and short circuit parameters at the first end when a second end of the guidance wire is alternately switched between an open circuit mode and a short circuit mode;

applying the plurality of alternating voltages of known amplitude and frequency for each of the known lengths to the second end wherein the seawater serves as an electrically grounded return for the guidance wire; and determining, for the plurality of alternating voltages at each of the known lengths open and short circuit parameters at the second end when the first end is alternately switched between an open circuit mode and a short circuit mode, wherein the open and short circuit parameters determined at both ends for the plurality of alternating voltages at each of the known lengths are used to generate equivalent circuit parameters indicative of the transmission line parameters.

2. A method as in claim 1 wherein said respective steps of determining open and short circuit parameters at the first and second end of the guidance wire includes the step of measuring voltage, current and electrical phase at the first and second ends, respectively.

3. A method for generating a predictive model matrix of transmission line parameters for an underwater vehicle's guidance wire, comprises the steps of:

a) deploying a known length of the guidance wire in seawater whereby a two-port network is formed at either end of the guidance wire;

b) generating an alternating voltage of known amplitude and frequency, and applying same to a first port formed at a first end of the guidance wire;

c) determining open and short circuit parameters at the first port when a second port formed at a second end of the guidance wire is alternately switched between an open circuit mode and a short circuit mode;

d) applying the alternating voltage of known amplitude and frequency to the second port;

e) determining open and short circuit parameters at the second port when the first port is alternately switched between an open circuit mode and a short circuit mode, wherein the open and short circuit parameters determined at both ports are used to generate equivalent circuit parameters of the two-port network indicative of the transmission line parameters at the known length: and f) repeating said steps a) through e) for a plurality of known lengths of the guidance wire to generate the predictive model matrix.

4. A method as in claim 3 wherein the open and short circuit parameters include voltage, current and electrical phase.

5. An apparatus for determining transmission line parameters of an underwater vehicle's guidance wire, comprising:

means for deploying a plurality of known lengths of the guidance wire in seawater;

first means for generating an alternating voltage of known amplitude and frequency;

second means for generating an alternating voltage of substantially the same amplitude and frequency as the voltage generated by said first generating means;

first means for selectively applying the alternating voltage of said first generating means to a first end of the guidance wire of each of the known lengths wherein the seawater serves as an electrically grounded return for the guidance wire;

second means for selectively applying the alternating voltage of said second generating means to a second end of the guidance wire of each of the known lengths wherein the seawater serves as an electrically grounded return for the guidance wire; and means for measuring voltage, current and phase at each of the known lengths: 1) at the first end when the second end is alternately switched between an open circuit mode and a short circuit mode, and 2) at the second end when the first end is alternately switched between a open and short circuit mode, wherein the open and short circuit voltage, current and phase measured at both ends are used to generate equivalent circuit parameters indicative of the transmission line parameters.

6. An apparatus as in claim 5 further comprising respective means at either end of the guidance wire for selectively switching the first and second ends between the generating means, the short circuit mode and the open circuit mode.

* * * * *